US010418812B2

(12) United States Patent
Lung et al.

(10) Patent No.: US 10,418,812 B2
(45) Date of Patent: Sep. 17, 2019

(54) ABNORMALITY DETECTION DEVICE FOR GRID INTERCONNECTION RELAY AND POWER CONDITIONER

(71) Applicant: TABUCHI ELECTRIC CO., LTD., Osaka-shi, Osaka (JP)

(72) Inventors: Chienru Lung, Osaka (JP); Hideki Hidaka, Amagasaki (JP)

(73) Assignee: TABUCHI ELECTRIC CO., LTD., Osaka (JP)

( * ) Notice: Subject to any disclaimer, the term of this patent is extended or adjusted under 35 U.S.C. 154(b) by 239 days.

(21) Appl. No.: 15/321,060

(22) PCT Filed: Nov. 26, 2015

(86) PCT No.: PCT/JP2015/083158
§ 371 (c)(1),
(2) Date: Dec. 21, 2016

(87) PCT Pub. No.: WO2017/090139
PCT Pub. Date: Jun. 1, 2017

(65) Prior Publication Data
US 2017/0271871 A1    Sep. 21, 2017

(51) Int. Cl.
*G01R 19/165*    (2006.01)
*H02J 3/00*       (2006.01)
(Continued)

(52) U.S. Cl.
CPC ............ *H02J 3/005* (2013.01); *G01R 19/165* (2013.01); *G01R 31/3275* (2013.01);
(Continued)

(58) Field of Classification Search
CPC . H02J 3/005; H02J 3/16; H02J 307/80; G01R 19/165; G01R 31/3275; H02H 7/122
(Continued)

(56) References Cited

U.S. PATENT DOCUMENTS

| 9,331,566 B1* | 5/2016 | Banayan ............. H02M 5/4585 |
| 2013/0175867 A1* | 7/2013 | Park ........................... H02J 3/32 |
| | | 307/66 |
| 2015/0263519 A1* | 9/2015 | Suzuki .................... H02J 3/005 |
| | | 700/297 |

FOREIGN PATENT DOCUMENTS

| JP | 2007-174792 A | 7/2007 |
| JP | 2008-035655 A | 2/2008 |

(Continued)

OTHER PUBLICATIONS

May 29, 2018 International Preliminary Report on Patentability issued in International Patent Application No. PCT/JP2015/083158.
(Continued)

*Primary Examiner* — Daniel Kessie
*Assistant Examiner* — Swarna N Chowdhuri
(74) *Attorney, Agent, or Firm* — Oliff PLC

(57) ABSTRACT

An abnormality detection device for a grid interconnection relay to detect an abnormality of the grid interconnection relay upon switching to grid independent operation, and includes an abnormality detector to execute commercial power system voltage determination of determining whether or not there is a commercial power system voltage, and first voltage determination to be executed if it is determined that there is no commercial power system voltage through the commercial power system voltage determination, of causing the power conditioner to chronologically alternately output monitor voltages having different values in a state where a contact of the grid interconnection relay is controlled to open and executing abnormality determination as to the grid interconnection relay according to whether or not each of the monitor voltages is followed by difference between a volt-
(Continued)

age of the power conditioner and voltage of the commercial power system with respect to corresponding one of the monitor voltages.

12 Claims, 11 Drawing Sheets

(51) Int. Cl.

| | |
|---|---|
| *G01R 31/327* | (2006.01) |
| *H02J 3/16* | (2006.01) |
| *H02J 3/38* | (2006.01) |
| *H02J 3/46* | (2006.01) |
| *H02H 7/122* | (2006.01) |

(52) U.S. Cl.
CPC ............... *H02H 7/122* (2013.01); *H02J 3/16* (2013.01); *H02J 3/383* (2013.01); *H02J 3/46* (2013.01); *Y02E 10/563* (2013.01)

(58) Field of Classification Search
USPC .......................................................... 307/80
See application file for complete search history.

(56) References Cited

FOREIGN PATENT DOCUMENTS

| | | |
|---|---|---|
| JP | 2011-135767 A | 7/2011 |
| JP | 2014-064415 A | 4/2014 |
| JP | 2015-100249 A | 5/2015 |

OTHER PUBLICATIONS

Apr. 11, 2017 Office Action issued in Japanese Patent Application No. 2016-521814.

\* cited by examiner

Welding at contact Sw detected

ABNORMALITY DETECTION DEVICE FOR GRID INTERCONNECTION RELAY AND POWER CONDITIONER

TECHNICAL FIELD

The present invention relates to an abnormality detection device for a grid interconnection relay and a power conditioner.

BACKGROUND ART

A distributed DC power supply including a solar cell, a fuel cell, or the like includes a power conditioner configured to convert a frequency and a voltage to AC power adapted to a commercial power system in order for use in interconnection with the commercial power system.

The power conditioner includes a DC/DC converter configured to adjust DC power generated by the solar cell, the fuel cell, or the like to DC power having a predetermined voltage value, a DC/AC inverter configured to convert the DC power outputted from the DC/DC converter to AC power, an LC filter configured to remove a high frequency component from an output waveform of the DC/AC inverter, and the like.

In a case where a shunt fault occurs on a distribution line used by the power conditioner in grid connected operation, connected to the solar cell, the fuel cell, or the like, or power transmission from a substation to the distribution line stops due to planned power outage or the like and islanding operation is established, in order to prevent influence on operation of a sectionalizing switch and secure safety during maintenance of the distribution line and the like, the power conditioner includes a control unit configured to open a grid interconnection relay to separate the distributed power supply from the distribution line.

When the control unit of the power conditioner subsequently closes a stand-alone power system relay, the distributed power supply supplies AC power to a stand-alone power system separated from the commercial power system or to an independent stand-alone power system not interconnected with the commercial power system.

The control unit of the power conditioner includes a current control block configured to control the DC/AC inverter so as to output an AC current in synchronization with a phase of the commercial power system upon grid interconnection, and a voltage control block configured to control the DC/AC inverter so as to output an AC voltage at a predetermined level to the stand-alone power system upon power system separation.

The voltage at the predetermined level corresponds to a voltage for low-voltage customers prescribed in Electricity Business Act, Article 26 and the Ordinance for Enforcement of the Act, Article 44, and falls within 101±6 V with respect to a standard voltage 100 V and within 202±20 V with respect to a standard voltage 200 V.

Upon grid independent operation of supplying power to a stand-alone power system while separated from a commercial power system, it is necessary to detect beforehand whether or not a contact of a grid interconnection relay is normal in order to prevent reverse charge to the commercial power system and asynchronous input. If the contact of the grid interconnection relay is abnormal due to welding or the like, it is necessary to inhibit transition from grid connected operation to grid independent operation.

Patent Literature 1 discloses a grid interconnection device including a filter circuit configured to smooth AC power from an inverter circuit, an inverter circuit controller configured to control an operation state of the inverter circuit, a controller configured to control an interconnected state or a separated state of a grid interconnection relay, a current detector connected between the filter circuit and the grid interconnection relay and configured to detect a current flowing to the filter circuit, and an abnormality detector configured to detect an abnormality of the grid interconnection device in accordance with a control state of the grid interconnection relay and a detection result by the current detector while the inverter circuit controller controls to stop the inverter circuit.

The abnormality detector is configured to determine whether or not the contact of the grid interconnection relay is welded in accordance with whether or not a reactive current flows from the commercial power system to a capacitor of the filter circuit while the inverter circuit is stopped.

Patent Literature 2 proposes a grid interconnection device configured to detect whether or not a first grid interconnection relay or a second grid interconnection relay each included in a grid interconnection relay has welding before a DC/AC inverter circuit is interconnected with a commercial power system by detecting, by means of a photocoupler or the like, a potential difference between an input end of the first grid interconnection relay and an output end of the second grid interconnection relay, and a potential difference between an output end of the first grid interconnection relay and an input end of the second grid interconnection relay while the commercial power system normally operates, the inverter circuit is controlled to stop, and the grid interconnection relay is controlled to open.

The grid interconnection device is configured to execute detection in a similar manner by operating the inverter circuit upon power cut of the commercial power system.

Patent Literature 3 discloses a grid interconnection inverter device configured to check that both an interconnection switch and an inverter circuit are normal and then safely start operation interconnected with a commercial power system.

The grid interconnection inverter device includes the inverter circuit configured to convert DC power supplied from a DC power supply to AC power, an output voltage detector configured to detect an output voltage of the inverter circuit, the interconnection switch configured to establish interconnection between the inverter circuit and the commercial power system, a grid voltage detector configured to detect a voltage of the commercial power system, and a control circuit configured to control the inverter circuit and the interconnection switch.

The control circuit is configured to check that the interconnection switch is opened in accordance with a detection value of the output voltage detector and then start the inverter circuit, and control to close the interconnection switch if the detection value of the output voltage detector is substantially equal to a detection value of the grid voltage detector.

The grid interconnection inverter device is provided, between the inverter circuit and the interconnection switch, with a current limiting resistor configured to consume a current generated by a voltage difference between the inverter circuit and the commercial power system, and a resistor short-circuit switch configured to short-circuit the current limiting resistor. The grid interconnection inverter device is configured to control to close the resistor short-circuit switch at predetermined timing after the control circuit closes the interconnection switch.

Patent Literature 4 discloses a power conversion device configured to detect an abnormality of a switch disposed between a power converter and a grid independent operation terminal.

The power conversion device includes the power converter configured to convert power supplied from an external device to predetermined power, a first switch connected between a grid connected operation terminal connected to a power system and the power converter, a second switch connected between the grid independent operation terminal connected to a load and the power converter, a voltage detector configured to detect a voltage of the grid independent operation terminal, and a controller configured to control the power converter, the first switch, and the second switch.

The controller is configured to output a control signal to each of the first switch and the second switch to open the switches, and execute abnormality determination of determining whether or not the second switch has an abnormality in accordance with a voltage of the grid independent operation terminal detected by the voltage detector in a control state of causing the power converter to output a predetermined voltage.

CITATION LIST

Patent Literature

Patent Literature 1: JP 2008-35655 A
Patent Literature 2: JP 2011-135767 A
Patent Literature 3: JP 2007-174792 A
Patent Literature 4: JP 2014-64415 A

SUMMARY OF INVENTION

Technical Problems

The abnormality detector in the grid interconnection device disclosed in Patent Literature 1 is configured to stop the inverter circuit upon grid interconnection or power system separation and detect whether or not a reactive current flows from the commercial power system to the filter circuit. The abnormality detector thus fails to detect an abnormality of the grid interconnection relay in a case where grid independent operation starts due to power cut of the commercial power system.

The grid interconnection device disclosed in Patent Literature 2 needs to include additional circuit elements configured to detect the potential difference between the input end of the first grid interconnection relay and the output end of the second grid interconnection relay and the potential difference between the output end of the first grid interconnection relay and the input end of the second grid interconnection relay. The grid interconnection device thus configured problematically leads to a high cost for these components.

Furthermore, power cut is detected only in accordance with whether or not the commercial power system voltage is within an appropriate range under operation rules, and is thus possibly detected erroneously due to noise. In a case where an abnormality of the grid interconnection relay is detected in accordance with voltages upstream and downstream of the relay contact upon operating the DC/AC inverter circuit during power cut of the commercial power system, abnormality detection is possibly executed erroneously depending on a connection state of a load to the commercial power system, due to hum noise, and the like.

The grid interconnection inverter device disclosed in Patent Literature 3 leads to a high cost for components and fails to achieve interconnection with the commercial power system if the resistor short-circuit switch is out of order.

The power conversion device disclosed in Patent Literature 4 highly possibly causes erroneous determination if the second switch is connected with a load connected to the stand-alone power system when the power converter outputs a predetermined voltage.

In view of the problems mentioned above, an object of the present invention is to provide an abnormality detection device for a grid interconnection relay, configured to accurately detect an abnormality of the grid interconnection relay when grid independent operation starts due to power cut of a commercial power system, with no need for a high cost for components, and also provide a power conditioner.

Solution to Problems

In order to achieve the object mentioned above, as recited in claim 1 of the patent claims, according to a first feature of an abnormality detection device for a grid interconnection relay of the present invention, the device is incorporated in a power conditioner configured to switch between grid connected operation by interconnection with a commercial power system via the grid interconnection relay and grid independent operation by power supply to a stand-alone power system via a stand-alone power system relay, the power conditioner includes an inverter configured to convert DC power to AC power and an LC filter configured to remove a high frequency component from an output voltage of the inverter, and the abnormality detection device for a grid interconnection relay is configured to detect an abnormality of the grid interconnection relay upon switching to grid independent operation and includes an abnormality detector configured to execute: commercial power system voltage determination of determining whether or not there is a commercial power system voltage; and first voltage determination to be executed if it is determined that there is no commercial power system voltage through the commercial power system voltage determination, of causing the power conditioner to chronologically alternately output monitor voltages having different values in a state where a contact of the grid interconnection relay is controlled to open and executing abnormality determination as to the grid interconnection relay according to whether or not each of the monitor voltages is followed by a difference between a voltage of the power conditioner and a voltage of the commercial power system with respect to corresponding one of the monitor voltages.

The commercial power system voltage determination is initially executed upon switching to grid independent operation to determine whether or not there is a commercial power system voltage. If it is determined that there is no commercial power system voltage, the first voltage determination is executed.

The first voltage determination includes chronologically alternately outputting the monitor voltages having the different values from the power conditioner in the state where the contact of the grid interconnection relay is controlled to open, and calculating the difference between the voltage of the power conditioner and the voltage of the commercial power system with respect to each of the monitor voltages. The grid interconnection relay is determined to be normal if the difference varies to follow the monitor voltage.

In a case where determination is executed in accordance with the difference between the voltage of the power conditioner and the voltage of the commercial power system with respect to a monitor voltage of a single value, the difference may be decreased by influence of hum noise generated at the commercial power system upon driving the inverter, or the like, to lead to erroneous determination that the grid interconnection relay is abnormal.

However, even if the monitor voltages are chronologically alternately outputted, the hum noise varies not so largely as the monitor voltages do. If the differences each between the voltage of the power conditioner and the voltage of the commercial power system with respect to each of the monitor voltages alter to follow the monitor voltages, the grid interconnection relay will be determined to be normal. In contrast, the grid interconnection relay will be determined to be abnormal if the differences each between the voltage of the power conditioner and the voltage of the commercial power system with respect to each of the monitor voltages do not follow the monitor voltages and do not vary largely.

As recited in claim 2, according to a second feature of the abnormality detection device in addition to the first feature, the first voltage determination includes abnormality determination as to the grid interconnection relay according to whether or not a product of the differences each between the voltage of the power conditioner and the voltage of the commercial power system with respect to the corresponding one of the monitor voltages is less than a predetermined reference value.

Whether or not the differences each between the voltage of the power conditioner and the voltage of the commercial power system tend to alter to follow the monitor voltages is indicated in a magnified manner by calculating the product of the differences each between the voltage of the power conditioner and the voltage of the commercial power system with respect to the each of the monitor voltages. Determination is thus executed accurately.

As recited in claim 3, according to a third feature of the abnormality detection device in addition to the second feature, assuming that a command value of a variable output voltage of the power conditioner is $\Delta E^*$, a confidence coefficient for adjustment of the command value $\Delta E^*$ of the variable output voltage and a reference value $E_{chk}$ is a, and a confidence coefficient for a commercial power system voltage $E_{Grid}$ is b, when chronologically alternately outputting at least monitor voltages having command values $E_{min}$ and $E_{max}$ ($E_{min} < E_{max}$) of an output voltage effective value indicated in mathematical expressions [Expression 1], the first voltage determination includes calculating a product $\Delta E_{CST}$ of differences $\Delta E$ each between the voltage of the power conditioner and the voltage of the commercial power system in accordance with mathematical expressions [Expression 2] assuming that a sampling time point is k, and executing abnormality determination as to the grid interconnection relay in accordance with whether or not the product $\Delta E_{CST}$ of the differences $\Delta E$ is less than the predetermined reference value $E_{chk}$. The command values $E_{min}$ and $E_{max}$ of the output voltage effective value are set in the ranges indicated in the mathematical expressions [Expression 1]. The confidence coefficient b is a ratio to the commercial power system voltage $E_{Grid}$.

$$\begin{cases} E_{max} = E^*_{sd.rms} + a \cdot \Delta E^* \\ E_{min} = E^*_{sd.rms} - a \cdot \Delta E^* \\ b \cdot E_{Grid} \le E_{max} - E_{min} \le 2 \cdot a \cdot \Delta E^* \\ 0 < a < 1 \\ 0 < b < 1 \end{cases} \quad [\text{Expression 1}]$$

$$\begin{cases} \Delta E(k) = |E^*_{sd.rms}(k) - E_{uv.rms}(k)| \\ \Delta E_{CST} = \Delta E(k-2) \cdot \Delta E(k-1) \cdot \Delta E(k) \\ \Delta E_{CST} < E_{chk} \\ E_{chk} < (a \cdot \Delta E^*)^3 \end{cases} \quad [\text{Expression 2}]$$

The power conditioner chronologically alternately outputs at least the monitor voltages of the command values $E_{min}$ and $E_{max}$ ($E_{min} < E_{max}$) of the output voltage effective value indicated in the mathematical expressions [Expression 1] corresponding to the command values of the output voltage effective value, and the difference $\Delta E$ between the voltage of the power conditioner and the voltage of the commercial power system is calculated when each of the monitor voltages is outputted, to calculate the product $\Delta E_{CST}$ of the differences $\Delta E$. Whether the grid interconnection relay is abnormal or normal is determined in accordance with a magnitude relation between the product $\Delta E_{CST}$ and the reference value $E_{chk}$. Specifically, the grid interconnection relay is determined to be normal if the product $\Delta E_{CST}$ is more than the reference value $E_{chk}$, and the grid interconnection relay is determined to be abnormal if the product $\Delta E_{CST}$ is less than the reference value $E_{chk}$.

As recited in claim 4, according to a fourth feature of the abnormality detection device in addition to the third feature, the command values $E_{min}$ and $E_{max}$ of the output voltage effective value are set in a range from $b \times E_{Grid}$ to $2 \times a \times \Delta E^*$ with respect to the rated voltage $E_{Grid}$ of the commercial power system.

When the command values of the output voltage effective value of the power conditioner alter between $E_{min}$ and $E_{max}$ in the abnormal state where the contact of the grid interconnection relay is welded, measured also at the commercial power system is a voltage having a substantially equal value so as to follow such variation. The product $\Delta E_{CST}$ in the mathematical expressions [Expression 1] thus has a relatively small value. When the command values of the output voltage effective value of the power conditioner alter between $E_{min}$ and $E_{max}$ in the normal state where the contact of the grid interconnection relay is not welded, measured at the commercial power system is only a voltage of hum noise slightly following such variation. The product $\Delta E_{CST}$ in the mathematical expressions [Expression 1] thus has a relatively large value.

If there is a small difference between the command values Ervin and $E_{max}$ of the output voltage effective value, there may not be recognized a large difference in product $\Delta E_{CST}$ between the case where the contact of the grid interconnection relay is welded and the case where the contact of the grid interconnection relay is not welded. In view of this, the command values $E_{min}$ and $E_{max}$ of the output voltage effective value are set to fall within the range from $b \times E_{Grid}$ to $2 \times a \times \Delta E^*$ so as to cause a significant difference in product $\Delta E_{CST}$ between the case where the contact of the grid interconnection relay is welded and the case where the contact of the grid interconnection relay is not welded.

As recited in claim 5, according to a fifth feature of the abnormality detection device in addition to any one of the first to fourth features, if it is determined that there is a commercial power system voltage through the commercial power system voltage determination, the abnormality detector is configured to set the output voltage of the power conditioner to zero and execute second voltage determination of abnormality determination as to the grid interconnection relay according to a magnitude relation between a difference between the voltage of the power conditioner and the voltage of the commercial power system, and a value obtained by multiplying the predetermined reference value by a predetermined confidence coefficient in a state where the contact of the grid interconnection relay is controlled to open.

If there is a commercial power system voltage and the contact of the grid interconnection relay is welded, the difference between the voltage value of the power conditioner and the voltage value of the commercial power system is substantially zero. Whether or not the grid interconnection relay has an abnormality is thus determined in accordance with the difference. The output voltage of the power conditioner is set to a different value upon abnormality detection in accordance with a result of the commercial power system voltage determination. It is thus possible to avoid beforehand defects such as reverse charge to the commercial power system and asynchronous input.

As recited in claim 6, according to a sixth feature of the abnormality detection device in addition to the first feature, the abnormality detector is configured to execute if it is determined that there is a commercial power system voltage through the commercial power system voltage determination, first current determination of abnormality determination as to the grid interconnection relay according to whether or not there is an input current to the power conditioner in the state where the contact of the grid interconnection relay is controlled to open, and if it is determined that there is no commercial power system voltage through the commercial power system voltage determination, second current determination of abnormality determination as to the grid interconnection relay according to whether or not there is an output current from the power conditioner in the state where the contact of the grid interconnection relay is controlled to open.

The commercial power system voltage determination is executed and whether or not there is a commercial power system voltage is determined upon switching to grid independent operation. The first current determination is executed if it is determined that there is a commercial power system voltage. In contrast, the second current determination is executed if it is determined that there is no commercial power system voltage.

The first current determination includes determining whether or not the grid interconnection relay has an abnormality in accordance with whether or not a current flows from the commercial power system into the power conditioner in the state where the contact of the grid interconnection relay is controlled to open.

The second current determination includes determining whether or not the grid interconnection relay has an abnormality in accordance with whether or not a current flows from the power conditioner to a load connected with the commercial power system in the state where the contact of the grid interconnection relay is controlled to open. Abnormality determination as to the grid interconnection relay is thus appropriately executed while avoiding reverse charge to the commercial power system and asynchronous input.

As recited in claim 7, according to a seventh feature of the abnormality detection device in addition to the sixth feature, assuming that the LC filter has capacitor capacity $C_{inv}$, internal resistance $R_c$, and a capacitor current $i_c$, and a stand-alone power system voltage $e_{sd}$ is a measurement value, the first current determination includes calculation, as the input current, of the capacitor current $i_c$ in accordance with a mathematical expression [Expression 3].

$$i_c = \frac{sC_{inv}}{sR_cC_{inv}+1} \cdot e_{sd} \qquad \text{[Expression 3]}$$

Measured with use of a known voltage detection circuit configured to detect an output voltage of a stand-alone power system is the stand-alone power system voltage $e_{sd}$, which is substituted into the mathematical expression [Expression 3] to calculate the value of the current flowing into the capacitor of the LC filter. Whether or not a current flows from the commercial power system via the grid interconnection relay is thus determined with no separate current detection circuit.

If the contact of the grid interconnection relay is welded, the commercial power system voltage and the stand-alone power system voltage have equal instantaneous values and variation in current flowing into the capacitor is captured. Whether or not the grid interconnection relay has welding is determined in accordance with a variation state of the current flowing into the capacitor. If the grid interconnection relay does not short-circuit, the current flowing into the capacitor is substantialy zero. In the mathematical expression, s is a Laplacian operator (Laplace transform).

As recited in claim 8, according to an eighth feature of the abnormality detection device in addition to the seventh feature, the first current determination includes determining that the grid interconnection relay has an abnormality if the input current measured in a predetermined sampling cycle has an absolute value not less than a predetermined threshold a plurality of consecutive times and the absolute value of the input current increases every time the output current is measured.

If the current value measured in the predetermined sampling cycle is not less than the predetermined threshold a plurality of times and the absolute value increases, it is determined that a current flows from the commercial power system into the capacitor configuring the LC filter.

As recited in claim 9, according to a ninth feature of the abnormality detection device in addition to any one of the sixth to eighth features, assuming that the LC filter has capacitor capacity $C_{inv}$, internal resistance $R_c$, an output voltage $e_{sd}$ at grid independent operation, and a capacitor current $i_c$, and an inverter current $i_{inv}$, is a measurement value, the second current determination includes calculating, as the output current, an output current $i_{sp}$ of the power conditioner in accordance with a mathematical expression [Expression 4].

$$i_{sp} = i_{inv} - i_c \qquad \text{[Expression 4]}$$

If there is no commercial power system voltage, the inverter is driven and the power conditioner outputs the predetermined stand-alone power system voltage $e_{sd}$, the inverter output current $i_{inv}$ thus measured and the stand-alone power system voltage $e_{sd}$ are substituted into the mathematical expression [Expression 3], and the output current $i_{sp}$ of the power conditioner is calculated in accordance with the mathematical expression [Expression 4]. If the contact of the grid interconnection relay is welded, there is detected a current flowing out of the power conditioner to the load connected with the commercial power system.

As recited in claim 10, according to a tenth feature of the abnormality detection device in addition to the ninth feature, the second current determination includes determining that the grid interconnection relay has an abnormality if a difference in absolute value of peak values of the output current of the power conditioner is not less than a predetermined threshold a plurality of consecutive times and the absolute value of the peak value decreases every time the output current is measured.

If a current flows out of the power conditioner to the load connected with the commercial power system, the voltage decreases and the current value gradually decreases. The second current determination includes, if the calculated difference in absolute value of the peak values of the output current of the power conditioner is not less than the predetermined threshold a plurality of consecutive times and the absolute value of the peak value decreases every time the output current is measured, determining that a current flows out of the power conditioner to the load connected with the commercial power system. If the commercial power system is connected with no load, the output current of the power conditioner has a constant peak value.

As recited in claim 11, according to an eleventh feature of the abnormality detection device in addition to any one of the first to tenth features, the abnormality detector is configured to execute abnormality detection processes after all contacts of the grid interconnection relay are controlled to open and execute the abnormality detection processes every time one of the contacts is controlled to close independently.

The number of contacts of the grid interconnection relay varies depending on whether the power conditioner has single-phase output or three-phase output. Furthermore, the results of the determination processes differ depending on which one of the contacts is welded. If the first current determination and the second current determination are executed after all the contacts of the grid interconnection relay are controlled to open and it is determined that there is welding, it is clarified that all the contacts are welded. If the first voltage determination and the second voltage determination are executed every time one of the contacts is controlled to close independently and it is determined that there is welding, it is clarified that the contact controlled to open is welded.

As recited in claim 12, according to a twelfth feature of the abnormality detection device in addition to any one of the first to eleventh features, the commercial power system voltage determination includes determining whether or not there is a commercial power system voltage in accordance with a magnitude relation between a value obtained by multiplying a preliminarily set output voltage set value of the power conditioner by a predetermined confidence coefficient and the commercial power system voltage, and a magnitude relation between a value obtained by multiplying a stand-alone power system frequency by a predetermined confidence coefficient and a commercial power system frequency.

Checking the commercial power system voltage as well as the commercial power system frequency enables accurate determination as to whether or not there is a commercial power system voltage with no error due to noise or the like.

As recited in claim 13, according to a feature of a power conditioner of the present invention, the power conditioner is of a single-phase or three-phase type and includes a control unit configured to switch between grid connected operation by interconnection with a commercial power system via a grid interconnection relay and grid independent operation by power supply to a stand-alone power system via a stand-alone power system relay, in which the control unit includes the abnormality detection device for the grid interconnection relay having any one of the first to eleventh features.

In a case where the abnormality detector determines that the contact of the grid interconnection relay is welded, defects such as reverse charge to the commercial power system and asynchronous input are prevented beforehand by avoiding grid independent operation.

Advantageous Effects of Invention

As described above, the present invention provides an abnormality detection device for a grid interconnection relay, configured to accurately detect an abnormality of the grid interconnection relay when grid independent operation starts due to power cut of a commercial power system with no need for a high cost for components, and also provides a power conditioner.

DESCRIPTION OF EMBODIMENTS

An abnormality detection device for a grid interconnection relay and a power conditioner according to the present invention will now be described below with reference to the drawings.

Figure 1:
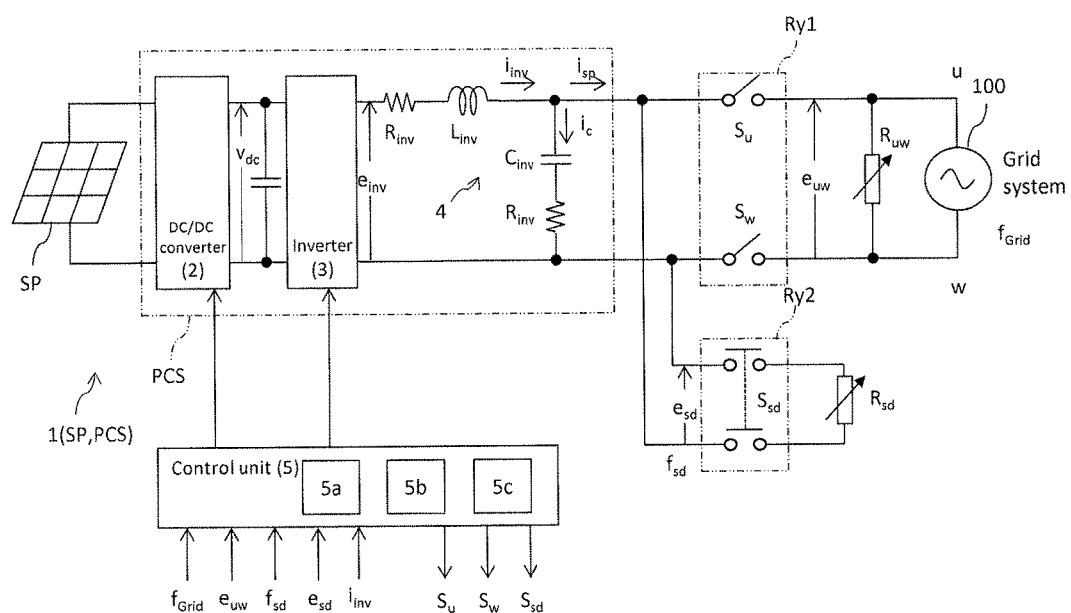
FIG. 1 is a circuit block configuration diagram of a distributed power supply including a power conditioner.

FIG. 1 depicts a solar power generator 1 exemplifying a distributed power supply. The solar power generator 1 includes a solar panel SP and a power conditioner PCS connected to the solar panel SP.

DC power generated by the solar panel SP is supplied to the power conditioner PCS via a DC circuit breaker and a surge suppressor (not depicted).

The power conditioner PCS includes a DC/DC converter 2 configured to raise a DC voltage generated by the solar panel SP to a predetermined DC link voltage $V_{dc}$, a DC/AC inverter 3 configured to convert the DC link voltage $V_{dc}$ raised by the DC/DC converter 2 to a predetermined AC voltage, an LC filter 4 configured to remove a higher harmonic wave from the AC voltage outputted from the DC/AC inverter 3, a control unit 5 configured to control the DC/DC converter 2 and the DC/AC inverter 3, and the like.

AC power converted by the power conditioner PCS is supplied to an AC load via a grid interconnection relay Ry1 in interconnection with a commercial power system 100. When the commercial power system 100 is separated due to power cut or the like, AC power is supplied to a load $R_{sd}$ connected to a stand-alone power system via a stand-alone power system relay Ry2.

FIG. 1 depicts the grid interconnection relay Ry1 having contacts $S_u$ and $S_w$ and the stand-alone power system relay Ry2 having two contacts $S_{sd}$.

The control unit 5 of the power conditioner PCS includes a microcomputer, a memory, a peripheral circuit having an input/output circuit provided with an AD conversion unit and the like. The microcomputer includes a CPU configured to achieve expected functions by causing control programs stored in the memory to be executed.

Specifically, embodied by the control unit 5 are functional blocks as a converter controller 5a configured to control a boosting switch of the DC/DC converter 2, an inverter controller 5b configured to control a switch included in a bridge of the DC/AC inverter 3, and an abnormality detector 5c configured to detect an abnormality of the grid interconnection relay Ry1.

The converter controller 5a is configured to monitor an input voltage, an input current, and an output voltage of the DC/DC converter 2 and control maximum power point tracking (MPPT) of operating the solar panel SP at a maximum power point, as well as control to boost the DC/DC converter 2 and output the predetermined DC link voltage $V_{dc}$ to the DC/AC inverter 3.

The inverter controller 5b is configured to control the inverter 3 so as to achieve grid connected operation via the grid interconnection relay Ry1, or to control the inverter 3 so as to achieve grid independent operation via the stand-alone power system relay Ry2.

The inverter controller 5b includes functional blocks such as a current control block configured to control an output current of the inverter 3 so as to synchronize with a phase of a commercial power system voltage upon grid connected operation, a voltage control block configured to supply the stand-alone power system with AC power having a predetermined voltage upon power system separation, and an islanding operation detection block configured to detect whether or not grid connected operation is in an islanding operation state.

The abnormality detector 5c is configured to detect whether or not the grid interconnection relay Ry1 has an abnormality upon transition from grid connected operation to grid independent operation. If detecting that the grid interconnection relay Ry1 has an abnormality of contact welding, the abnormality detector 5c is configured to turn ON an alarm indicative of trouble and stop grid independent operation control by the inverter controller 5b. In other words, the abnormality detector 5c functions as the abnormality detection device according to the present invention.

The AD conversion unit in the control unit 5 receives a monitor signal of an output current detected by a current transformer provided downstream of an inductor L configuring the LC filter 4.

Furthermore, the AD conversion unit in the control unit 5 receives a monitor signal of a stand-alone power system voltage $e_{sd}$ of the power conditioner PCS detected by a resistance voltage divider circuit provided upstream of the stand-alone power system relay Ry2, as well as a monitor signal of a commercial power system voltage $e_{uw}$ detected by a resistance voltage divider circuit provided downstream of the grid interconnection relay Ry1.

The stand-alone power system voltage $e_{sd}$ and a stand-alone power system frequency $f_{sd}$ of the power conditioner PCS as well as the commercial power system voltage $e_{uw}$ and a commercial power system frequency $f_{Grid}$ are obtained in accordance with the monitor signals received by the AD conversion unit.

The inverter controller 5b closes the grid interconnection relay Ry1 to achieve grid connected operation if power generated by the solar panel SP has a value enabling interconnection with the commercial power system, and opens the grid interconnection relay Ry1 to achieve separation from the commercial power system if power generated by the solar panel SP decreases or the islanding operation detection block detects the islanding operation state.

If power generated by the solar panel SP has an adequate value for grid independent operation during separation from the commercial power system due to the islanding operation state, the inverter controller 5b starts the abnormality detector 5c for detection of an abnormality of the Grid interconnection relay Ry1.

If the abnormality detector 5c determines that the grid interconnection relay Ry1 is normal, the inverter controller 5b is configured to start the inverter 3 and open the stand-alone power system relay Ry2 to achieve grid independent operation. In contrast, if the abnormality detector 5c determines that the grid interconnection relay Ry1 is abnormal, the inverter controller 5b is configured to stop the DC/AC inverter 3 without closing the stand-alone power system relay Ry2.

Described below is a method of detecting an abnormality of the grid interconnection relay Ry1, which is executed by the abnormality detector 5c.

Abnormality detection executed by the abnormality detector 5c includes contact control of controlling to open or close the contacts of the grid interconnection relay Ry1, commercial power system voltage determination, setting an output voltage of the inverter 3, voltage determination, and current determination.

The abnormality detector 5c is configured to execute the current determination and the voltage determination to be described later, of determining whether or not the contacts are welded after all the contacts $S_u$ and $S_w$ of the grid interconnection relay Ry1 are controlled to open, and execute the current determination and the voltage determination every time the contact $S_u$ or $S_w$ is controlled to close.

If the abnormality detector 5c executes the current determination and the voltage determination after all the contacts $S_u$ and $S_w$ of the grid interconnection relay Ry1 are controlled to open and determines that the contacts are welded, it is clarified that all the contacts $S_u$ and $S_w$ are welded.

If the abnormality detector 5c determines that the grid interconnection relay Ry1 is normal, the abnormality detector 5c executes the current determination and the voltage determination every time the contact $S_u$ or $S_w$ is controlled to close independently. If the abnormality detector 5c determines that the contact is welded in either one of the cases, it is clarified that the contact being controlled to open upon the determination is welded.

Figure 2:
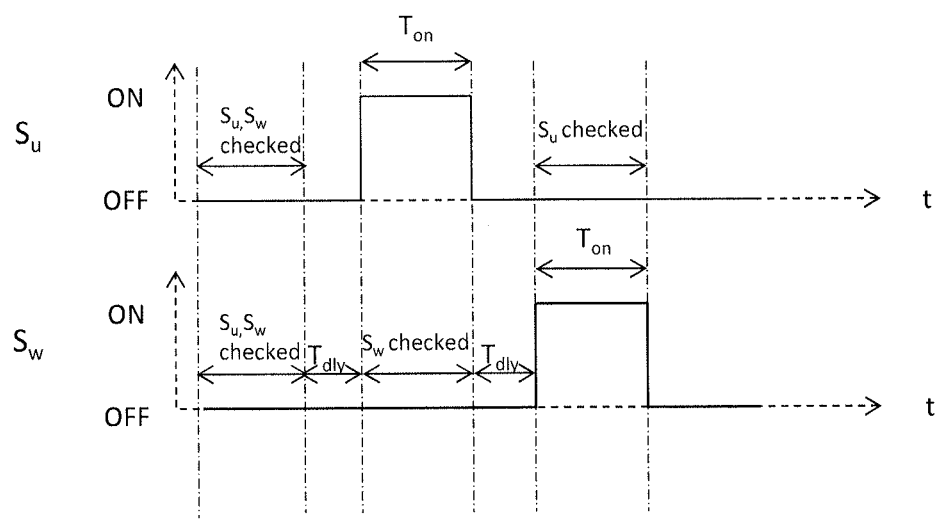
FIG. 2 is an explanatory chart of ON/OFF operation of a grid interconnection relay upon abnormality detection.

FIG. 2 indicates timing of ON/OFF control of the contacts $S_u$ and $S_w$ of the grid interconnection relay Ry1. When the abnormality detector 5c starts, the abnormality detector 5c executes the current determination and the voltage determination to check the contacts $S_u$ and $S_w$ that are controlled to open, controls to close the contact $S_u$ after a predetermined delay period $T_{dly}$ and executes the current determination and the voltage determination to check the contact $S_w$, and controls to open the contact $S_u$ then controls to close the contact $S_w$ after another predetermined delay period $T_{dly}$ and executes the current determination and the voltage determination to check the contact $S_u$.

Each check period is set to 1 sec. and the delay period $T_{dly}$ is set to 300 msec. in the present embodiment. At least a check period $T_{on}$ has only to be set to satisfy $T_{on} \geq 3\ T_{dly}$. Such an open/close control sequence for the grid interconnection relay Ry1 corresponds to the step of the contact control described above. The delay period $T_{dly}$ is variable appropriately in accordance with the type of the grid interconnection relay.

Figure 3:
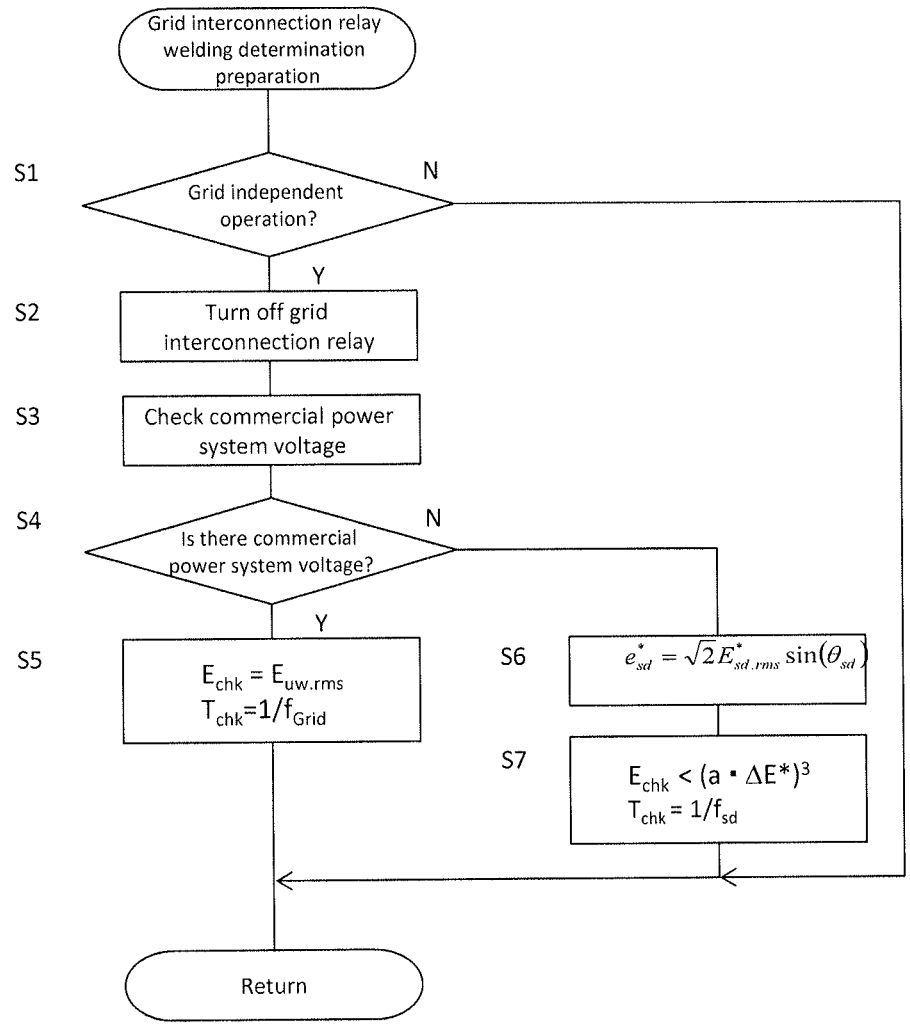
FIG. 3 is a flowchart of commercial power system voltage determination.

FIG. 3 depicts a welding determination preparation flow of the grid interconnection relay Ry1 executing the steps of the commercial power system voltage determination and the voltage setting.

In the commercial power system voltage determination step, in a case where grid independent operation is required (S1), all the contacts of the grid interconnection relay Ry1 are controlled to open (S2), the commercial power system voltage is checked by the resistance voltage divider circuit provided downstream of the grid interconnection relay Ry1 (S3), and whether or not there is a commercial power system voltage is checked in accordance with the following mathematical expressions [Expression 5] (S4).

$$\begin{cases} |e_{uw}| \geq x \cdot E^*_{sd.rms} \\ f_{Grid} \geq x \cdot f_{sd} \end{cases} \quad \text{[Expression 5]}$$

In the mathematical expressions, $E^*_{sd.rms}$ is a command value of an output voltage effective value at grid independent operation, and x is a confidence coefficient set in the range 0<x<1 for securing determination accuracy and set to 0.5 in the present embodiment. The stand-alone power system frequency $f_{sd}$ is set to be equal to the commercial power system frequency $f_{Grid}$. The command value $E^*_{sd.rms}$ according to the present embodiment is set to 40 V that is lower than 100 V of a rated output voltage effective value at grid independent operation.

The commercial power system voltage is measured for at least one cycle (20 msec. in a case where the commercial power system frequency is 50 Hz) and an absolute value $|e_{uw}|$ of a maximum instantaneous value is obtained. The absolute value $|e_{uw}|$ is compared with a product of the command value $E^*_{sd.rms}$ of the output voltage effective value at grid independent operation and the confidence coefficient x. The commercial power system voltage is alternatively measured for a plurality of cycles to obtain an average of the absolute values $|e_{uw}|$ of the maximum instantaneous values of the respective cycles.

Furthermore, the commercial power system frequency $f_{Grid}$ is compared with a product of the stand-alone power system frequency $f_{sd}$ and the confidence coefficient x. The confidence coefficient x has a value for securement of determination reliability. As the value is more approximate to 1, determination is stricter with more influence of noise. In contrast, as the value is more approximate to 0, determination is less strict with less influence of noise. An intermediate value of 0.5 is preferred to be adopted typically.

In a case where the commercial power system voltage $|e_{uw}|$ is 0 V, the command value $E^*_{sd.rms}$ of the effective value of the stand-alone power system voltage is 40 V, and x is 0.5, the mathematical expressions [Expression 5] are as follows.

$$|e_{uw}|=0<0.5\times40=20$$

$$f_{Grid}=0<0.5\times50=25$$

In a case where the commercial power system voltage $|e_{uw}|$ is 283 V, the command value $E^*_{sd.rms}$ of the effective value of the stand-alone power system voltage is 40 V, and x is 0.5, the mathematical expressions [Expression 5] are as follows.

$$|e_{uw}|=283<0.5\times40=20$$

$$f_{Grid}=50<0.5\times50=25$$

Specifically, in step S4, it is determined that there is a commercial power system voltage if the two mathematical expressions [Expression 5] are both satisfied, and it is determined that there is no commercial power system voltage if none of the mathematical expressions is satisfied.

Steps S3 and S4 described above correspond to the commercial power system voltage determination step of determining whether or not there is a commercial power system voltage in accordance with a magnitude relation between a value obtained by multiplying a preliminarily set output voltage set value of the power conditioner PCS by a predetermined confidence coefficient and the commercial power system voltage, and a magnitude relation between a value obtained by multiplying a stand-alone power system frequency by a predetermined confidence coefficient and a commercial power system frequency.

The preliminarily set output voltage set value of the power conditioner PCS can have a voltage value necessary for grid independent operation, or can have an exclusive voltage value for abnormality detection, which is less than the voltage value. Even in a case where the commercial power system voltage is different from the grid independent operation voltage, whether or not there is a commercial power system voltage is determined accurately by appropriately setting the output voltage set value and the confidence coefficient.

As in the mathematical expressions [Expression 5], checking the commercial power system voltage as well as the commercial power system frequency enables accurate determination as to whether or not there is a commercial power system voltage with no error due to noise or the like.

If it is determined that there is a commercial power system voltage in the commercial power system voltage determination step, a reference value $E_{chk}$ for contact welding determination in the voltage determination is set to an effective value $E_{uw.rms}$ of the commercial power system voltage, and a delay period $T_{chk}$ for determination of a difference between the stand-alone power system voltage and the commercial power system voltage is set to a reciprocal of the commercial power system frequency (S5).

If it is determined that there is no commercial power system voltage, a command value of the output voltage of the power conditioner PCS at abnormality detection is set (S6), the reference value $E_{chk}$ for contact welding determination is set to be less than $(\cdot \Delta E^*)^3$ included in mathematical expressions [Expression 14] to be mentioned later, and the delay period $T_{chk}$ in this case is set to a reciprocal of the stand-alone power system frequency (S7).

In other words, if it is determined that there is a commercial power system voltage, the power conditioner PCS is stopped to have the output voltage of 0 V. Steps S5 to S7 described above correspond to the voltage setting step.

The output voltage mentioned above has a command value e satisfying the following mathematical expression [Expression 6].

$$e^*_{sd} = \sqrt{2} E^*_{sd.rms} \sin(\theta_{sd}) \qquad \text{[Expression 6]}$$

In the mathematical expression, $E^*_{sd.rms}$ is the command value of the effective value of the stand-alone power system voltage and $\theta_{sd}$ is a phase angle of the stand-alone power system voltage. In the present embodiment, $E^*_{sd.rms}=40$ V is the command value at detection of an abnormality of the grid interconnection relay Ry1, and the command value $E^*_{sd.rms}$ after normality determination is 100 V. The command value for the abnormality detection and the command value after normality determination are merely exemplary and can be set appropriately.

The commercial power system voltage determination step of determining whether or not there is a commercial power system voltage is executed before the voltage setting step, and the voltage setting step includes setting the stand-alone power system voltage of the power conditioner PCS and the reference value $E_{chk}$ for abnormality determination as to the grid interconnection relay Ry1 to different values in accordance with the result of the commercial power system voltage determination step.

The power conditioner PCS is controlled by the control unit 5 so as to transition to grid independent operation upon power cut of the commercial power system, but the commercial power system voltage temporarily decreases and recovers shortly in some cases. If the grid interconnection relay Ry1 has welding in such cases, an inconvenient situation with asynchronous input or the like may cause damage to the power conditioner PCS.

By executing the commercial power system voltage determination before the voltage setting so as to set the stand-alone power system voltage of the power conditioner PCS and the reference value for abnormality determination as to the grid interconnection relay Ry1 to different values in accordance with the result of the commercial power system voltage determination, abnormality determination as to the grid interconnection relay is executed accurately with secured safety to avoid asynchronous input and reverse charge.

In a case where a commercial power system voltage is detected, contact welding determination is executed accurately with no damage to the power conditioner PCS by setting the stand-alone power system voltage of the power conditioner PCS to 0 V and the commercial power system voltage to the reference value.

Figure 4:
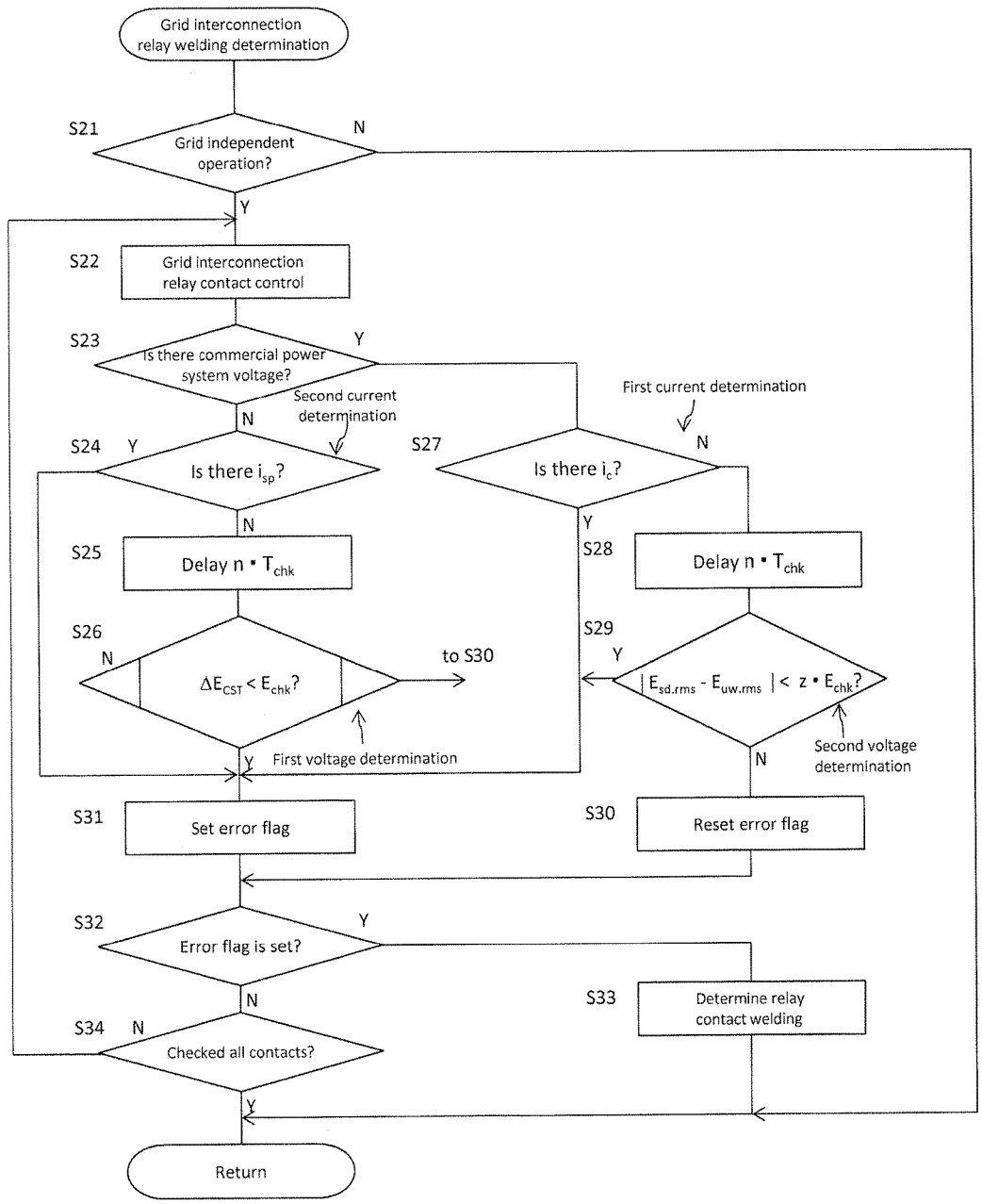
FIG. 4 is a flowchart of a method of detecting an abnormality of the grid interconnection relay.

FIG. 4 depicts a contact welding determination flow of the grid interconnection relay Ry1 according to the present invention.

If grid independent operation starts (S21), the contact control step is executed (S22). If it is determined that there is a commercial power system voltage through the commercial power system voltage determination (S23, Y), first current determination (S27) of abnormality determination as to the grid interconnection relay Ry1 is executed in accordance with whether or not the power conditioner PCS has an input current in the state where the contacts of the grid interconnection relay Ry1 are controlled to open.

If it is determined that there is no commercial power system voltage through the commercial power system voltage determination (S23, N), second current determination (S24) of abnormality determination as to the grid interconnection relay Ry1 is executed in accordance with whether or not the power conditioner PCS has an output current in the state where the contacts of the grid interconnection relay Ry1 are controlled to open.

If the grid interconnection relay Ry1 is determined to have no abnormality through the first current determination (S27, N), the output voltage $e_{sd}$ of the power conditioner PCS and the effective value of the commercial power system voltage e W are measured during a predetermined delay period $n \sim T_{chk}$ (n is a positive integer) (S28) and second voltage determination is executed (S29).

If the grid interconnection relay Ry1 is determined to have no abnormality through the second current determination (S24, N), the output voltage $e_{sd}$ of the power conditioner PCS and the effective value of the commercial power system voltage $e_{uw}$ are measured during a predetermined delay period $n \cdot T_{chk}$ (n is a positive integer) (S25) and first voltage determination is executed (S26).

Determined in step S32 is an error flag state. If an error flag is set (S32, Y), a corresponding relay contact is determined to be welded and accordingly executed is abnormality handling of turning ON abnormality indication on the display panel of the power conditioner PCS or the like (S33).

As long as no set error flag is found in step S32 (S32, N), the process from steps S22 to S34 is repeated until abnormality determination is completed in each of the three states, namely, the state where all the contacts $S_u$ and $S_w$ of the grid interconnection relay Ry1 are controlled to open, and the states where either one of the contacts $S_u$ and $S_w$ is controlled to close. Described in detail below are processes of the current determination and the voltage determination.

In the first current determination (S27), assuming that the LC filter 4 has capacitor capacity $C_{inv}$, internal resistance $R_c$, and a capacitor current $i_c$, and the stand-alone power system voltage $e_{sd}$ is a measurement value, calculated as an input current is the capacitor current $i_c$ in accordance with the following mathematical expression [Expression 7]. In the mathematical expression, s is a Laplacian operator (Laplace transform).

$$i_c = \frac{sC_{inv}}{sR_c C_{inv} + 1} \cdot e_{sd} \qquad \text{[Expression 7]}$$

The stand-alone power system voltage $e_{sd}$ is measured with use of the resistance voltage divider circuit configured to detect the output voltage $e_{sd}$ of the inverter, and the measurement value is substituted into the mathematical expression [Expression 7] to calculate a value of a current flowing into the capacitor of the LC filter 4.

If the grid interconnection relay Ry1 has a welded contact, the commercial power system voltage $e_{uw}$ and the stand-alone power system voltage $e_{sd}$ are regarded as having equal detection values.

Figure 6:
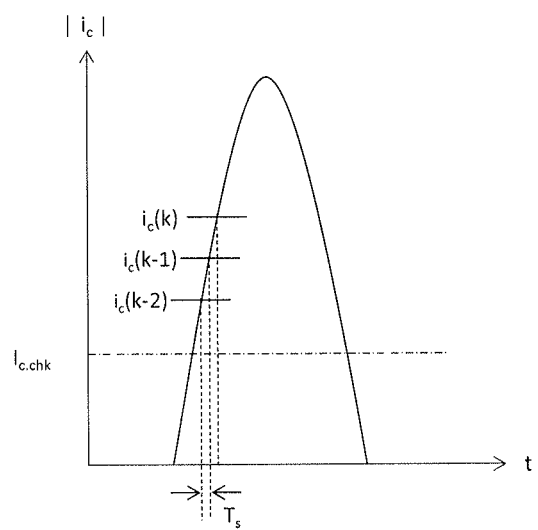
FIG. 6 is an explanatory graph of first current determination.

As indicated in FIG. 6, in the first current determination, in order to determine a variation state of an absolute value $|i_c|$ of the instantaneous capacitor current $i_c$ measured and calculated in a predetermined sampling cycle $T_s$, if satisfying conditions that the absolute value $|i_c|$ is not less than a threshold $I_{c.chk}$ at least three consecutive times and its value tends to increase (S27, Y), the grid interconnection relay Ry1 is determined to have a welded contact and a flag is set in an error flag memory area set in the memory (S31). Determination is optionally repeated a plurality of times in consideration of erroneous detection due to noise and in order for reliable detection of the variation state.

The threshold $I_{c.chk}$ can be obtained in accordance with the following mathematical expression [Expression 8]. In the mathematical expression, $P_{sd.rated}$ is rated output power at grid independent operation, $E*_{sd.rms}$ is the command value of the effective value of the stand-alone power system voltage, and y is a confidence coefficient having a positive number satisfying y<1.

$$I_{c.chk} = y \cdot \frac{P_{sd.rated}}{\sqrt{2} \cdot E^*_{sd.rms}}$$ [Expression 8]

The display panel of the power conditioner PCS is configured to turn ON abnormality indication when an error flag is set. In a case where the present embodiment is designed such that the command value $E*_{sd.rms}$ of the effective value of the stand-alone power system voltage is 100 V and the threshold $I_{c.chk}$ is 10% of a rated current (y=0.1) with the rated power $P_{sd.rated}$ of 1.5 kW at grid independent operation as a reference value, the threshold $I_{c.chk}$ is set to 1 A and the sampling cycle $T_s$ is set to 50 μsec. (corresponding to a switching cycle of the DC/AC inverter). The threshold is set to 10% of the rated current ((0.1×1500)/(100×1.414)=1). The predetermined sampling cycle $T_s$ has only to satisfy a condition of a reciprocal of a maximum switching frequency of a switching element configuring the inverter.

In order to determine the variation state of the absolute value $|i_c|$ of the instantaneous capacitor current $i_c$ in step S27, if a state not satisfying the conditions that the absolute value $|i_c|$ is not less than the threshold $I_{c.chk}$ at least three consecutive times and its value tends to increase lasts for a predetermined period (e.g. several cycles), it is determined that there is no current flowing from the commercial power system to the capacitor of the power conditioner PCS (S27, N) and the process flow proceeds to the voltage determination in step S28. Determination is optionally repeated a plurality of times in consideration of erroneous detection due to noise and in order for reliable detection of the variation state. If there is a commercial power system voltage and the contacts of the grid interconnection relay Ry1 are normal with no welding, the absolute value $|i_c|$ of the instantaneous capacitor current $i_c$ is constantly zero.

In the second current determination (S24), calculated from the capacitor capacity $C_{inv}$, the internal resistance $R_c$, the stand-alone power system voltage $e_{sd}$, and the capacitor current $i_c$ of the LC filter 4 and the inverter output current $i_{inv}$ as a measurement value in accordance with the following mathematical expression [Expression 9] is an output current $i_{sp}$ of the power conditioner PCS as an output current to the load connected with the commercial power system.

$$i_{sp} = i_{inv} - i_c$$ [Expression 9]

If there is no commercial power system voltage, the inverter 3 is driven and the power conditioner PCS outputs the predetermined stand-alone power system voltage $e_{sd}$, the capacitor current $i_c$ obtained from the inverter current $i_{inv}$ thus measured and the stand-alone power system voltage $e_{sd}$ in accordance with the mathematical expression [Expression 7] is substituted into the mathematical expression [Expression 9] to calculate the output current $i_{sp}$ of the power conditioner PCS. The stand-alone power system voltage $e_{sd}$ is detected by the resistance voltage divider circuit configured to detect the output voltage $e_{sd}$ of the inverter.

If the grid interconnection relay Ry1 has a welded contact, there is detected a current flowing out of the power conditioner PCS to the load $R_{uw}$ connected to the commercial power system.

Figure 7:
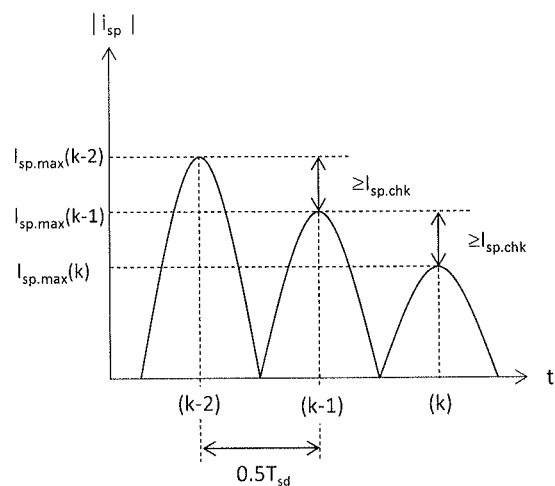
FIG. 7 is an explanatory graph of second current determination executed when a current is not less than a determination threshold.

As indicated in FIG. 7, in the second current determination, in order to determine a variation state of a difference in maximum value $I_{sp.max}$ of the output current $i_{sp}$ of the power conditioner PCS, if the difference is not less than a predetermined threshold $I_{sp.chk}$ three consecutive times and the instantaneous output current $i_{sp}$ has an absolute value $|i_{sp}|$ tending to decrease (S24, Y), the grid interconnection relay Ry1 is determined to have a welded contact and a flag is set in the error flag memory area set in the memory (S31). Determination is optionally repeated a plurality of times in consideration of erroneous detection due to noise and in order for reliable detection of the variation state.

The maximum value $I_{sp.max}$ of the output current $i_{sp}$ is obtained in accordance with a mathematical expression [Expression 10], and the threshold $I_{sp.chk}$ is obtained in accordance with a mathematical expression [Expression 11]. In the mathematical expression [Expression 11], $E*_{sd.rms}$ is the command value of the effective value of the output voltage at grid independent operation.

$$I_{sp.max} = \sqrt{\frac{4}{T_{sd}} \int_0^{\frac{T_{sd}}{2}} i_{sp}^2(t) dt}$$ [Expression 10]

$$I_{sp.chk} = y \cdot \frac{P_{sd.rated}}{\sqrt{2} \cdot E^*_{sd.rms}}$$ [Expression 11]

If a current flows out of the power conditioner PCS to the load $R_{uw}$ connected with the commercial power system, the voltage decreases and the current value gradually decreases. In the second current determination, if the calculated difference in maximum value of the output current of the power conditioner PCS is not less than the predetermined threshold a plurality of consecutive times and the absolute value $|i_{sp}|$ of the instantaneous output current $i_{sp}$ tends to decrease, it is determined that a current flows out of the power conditioner PCS to the load $R_{uw}$ connected with the commercial power system.

Figure 8:
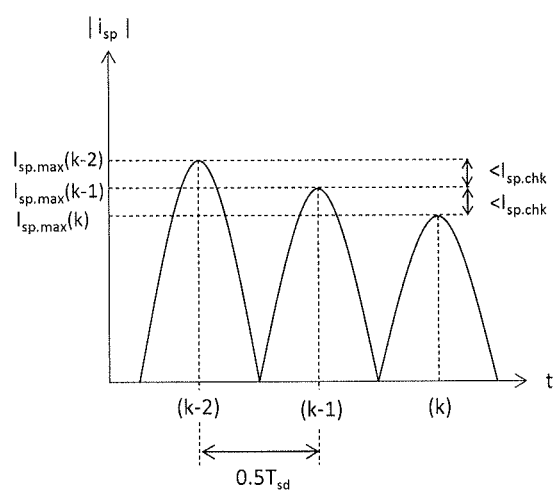
FIG. 8 is an explanatory graph of the second current determination executed when a current is not more than the determination threshold.

If the contacts of the grid interconnection relay Ry1 are normal with no welding and the commercial power system is connected with no load or a light load, the maximum value $I_{sp.max}$ of the output current $i_{sp}$ of the power conditioner PCS is regarded as constantly being not more than the predetermined threshold $I_{sp.chk}$, as indicated in FIG. 8.

The display panel of the power conditioner PCS turns ON abnormality indication when an error flag is set in step S31. In a case where the present embodiment is designed such that the command value $E*_{sd.rms}$ of the effective value of the stand-alone power system voltage is 100 V and the threshold $I_{sp.chk}$ is 10% of the rated current (y=0.1) with the rated power $P_{sd.rated}$ of 1.5 kW at grid independent operation as a reference value, the threshold $I_{sp.chk}$ is set to 1 A and the sampling cycle is set to 0.5 $T_{sd}$ (see FIG. 6). The sampling cycle is 10 msec. if the stand-alone power system frequency is 50 Hz.

In step S27, as to a variation state of the maximum value $I_{sp.max}$ of the output current $i_{sp}$, if a state not satisfying conditions that the maximum value $I_{sp.max}$ is less than the threshold $I_{sp.chk}$ at least three consecutive times and its value tends to increase lasts for a predetermined period (e.g. several cycles) as indicated in FIG. 8, it is determined that the commercial power system is connected with no load or a light load (S27, N). The process flow then proceeds to the second voltage determination starting in step S28. Determination is optionally repeated a plurality of times in consideration of erroneous detection due to noise and in order for reliable detection of the variation state.

In the second voltage determination, the stand-alone power system voltage $e_{sd}$ of the power conditioner PCS and the effective value of the commercial power system voltage $e_{uw}$ are measured during the predetermined delay period $n \cdot T_{chk}$ (n is a positive integer), and a magnitude relation is determined between an absolute value $|E_{sd.rms} - E_{uw.rms}|$ of the difference between these values and a value obtained by multiplying the reference value $E_{chk}$ set in the voltage setting step by a predetermined confidence coefficient z (S29).

In a case where the grid interconnection relay Ry1 has no welded contact, it is detected that the commercial power system voltage is 200 V and the output voltage of the power conditioner PCS is 0 V. Assuming the confidence coefficient z=0.5 (z is a positive number satisfying z<1), a comparison value 100 V (=200×0.5) is less than the absolute value $|E_{sd.rms} - E_{uw.rms}|$=200 V of the difference.

In another case where the grid interconnection relay Ry1 has a welded contact, it is detected that the commercial power system voltage is 200 V and the output voltage of the power conditioner PCS is 200 V. In this case, the comparison value 100 V (=200×0.5) is more than the absolute value $|E_{sd.rms} - E_{uw.rms}|$=0 V of the difference.

If the value obtained by multiplying the reference value $E_{chk}$ by the confidence coefficient z is determined to be more than the absolute value $|E_{sd.rms} - E_{uw.rms}|$ of the difference in step S29, the grid interconnection relay Ry1 is determined to have a welded contact and a flag is set in the error flag memory area set in the memory (S31).

If the value obtained by multiplying the reference value $E_{chk}$ by the confidence coefficient z is determined to be less than the absolute value $|E_{sd.rms} - E_{uw.rms}|$ of the difference, the grid interconnection relay Ry1 is determined to be normal and the error flag in the error flag memory area set in the memory is reset (S30).

The delay period $T_{chk}$ is set to three cycles (n=3) of the commercial power system frequency or the stand-alone power system frequency so as to enable calculation of the effective value according to sampling values for at least the three cycles. The delay period $T_{chk}$ has only to be set to a plurality of cycles and is not limited to the three cycles.

If no welding of the grid interconnection relay Ry1 is detected in the second current determination in step S24 (S24, OK), the first voltage determination starting in step S25 is executed.

Figure 5:
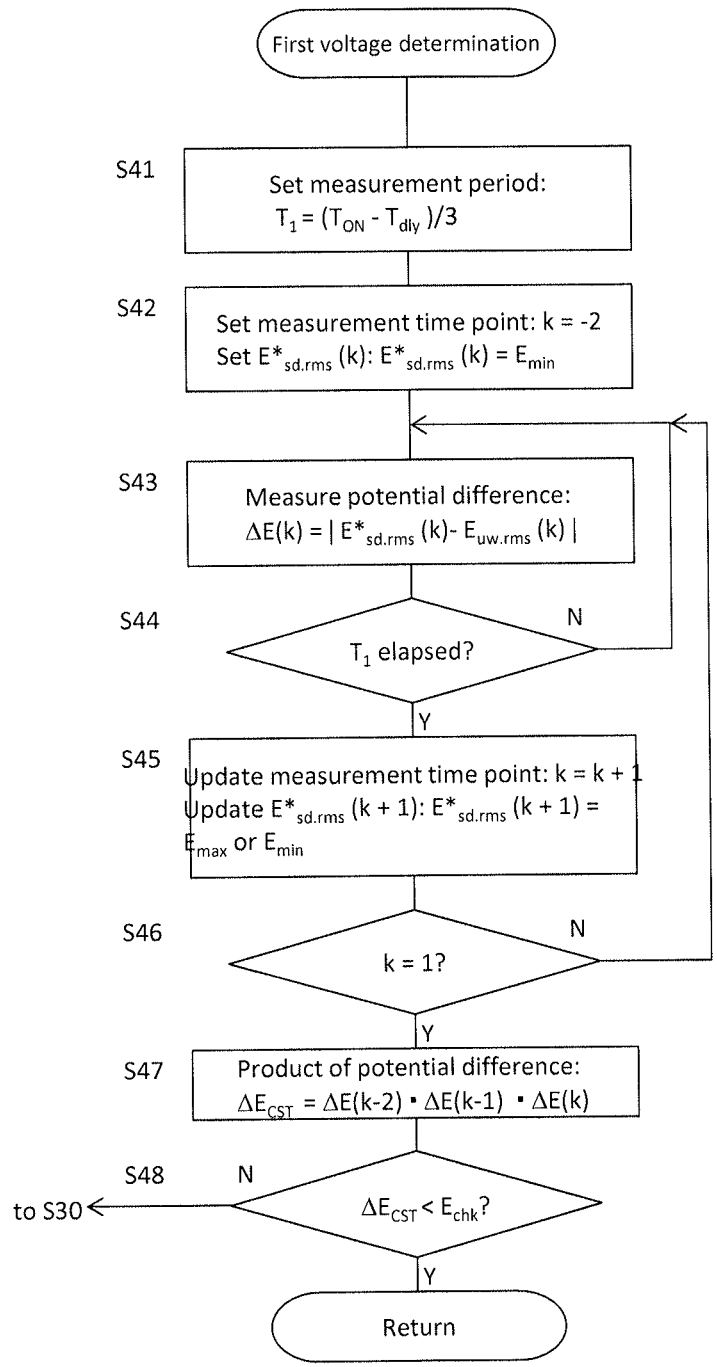
FIG. 5 is a flowchart of first voltage determination.

FIG. 5 depicts a specific procedure of the first voltage determination.

In the first voltage determination, a mathematical expression [Expression 12] sets a processing period $T_1$ for determination as to whether or not the grid interconnection relay Ry1 has an abnormality (S41).

$$T_1 = (T_{ON} - T_{dly})/3 \qquad \text{[Expression 12]}$$

As indicated in FIG. 2, $T_{ON}$ in the mathematical expression [Expression 11] is a period for measurement of mainly a voltage of the power conditioner PCS and a voltage of the commercial power system in a state where each of the contacts of the grid interconnection relay Ry1 is controlled to open or close in the contact control of the grid interconnection relay Ry1, and $T_{dly}$ is a period necessary for calculation with the measurement values. In the present embodiment, $T_{ON}$ is set to 1.0 sec. and the delay period $T_{dly}$ is set to 300 msec.

Upon completion of the setting, an initial value of a measurement time point k is set to "-2", and the power conditioner PCS outputs a monitor voltage $E_{min}$ as a command value $E_{sd.rms}^*$ of the output voltage effective value included in mathematical expressions [Expression 13] in the state where all the contacts $S_u$ and $S_w$ of the grid interconnection relay Ry1 are controlled to open (S42).

The commercial power system voltage $e_{uw}$ is then measured and the effective value $E_{uw.rms}$ is calculated, an absolute value $\Delta E(k)$ of a difference between the command value $E_{min}$ of the output voltage effective value of the power conditioner PCS and the voltage effective value $E_{uw.rms}$ of the commercial power system is calculated and stored in the memory (S43).

The process in step S43 is continuously executed until the processing period $T_1$ elapses. If the processing period $T_1$ elapses (S44, Y), "1" is added to the measurement time point k and the output voltage of the power conditioner PCS is updated to a command value $E_{max}$ of the output voltage effective value included in the mathematical expressions [Expression 13] and is outputted (S45).

The process of measurement in steps S43 to S45 is repeated three times until the measurement time point k set to the initial value k="-2" reaches "1" (S46), and the monitor voltage outputted from the power conditioner PCS during this period is switched from $E_{min}$ to $E_{max}$, and then to $E_{min}$ chronologically. In the mathematical expressions, $\Delta E^*$ is a command value of a variable output voltage of the power conditioner, whereas a and b are confidence coefficients set to the ranges 0<a<1 and 0<b<1, respectively.

$$\begin{cases} E_{max} = E_{sd.rms}^* + a \cdot \Delta E^* \\ E_{min} = E_{sd.rms}^* - a \cdot \Delta E^* \\ b \cdot E_{Grid} \leq E_{max} - E_{min} \leq 2 \cdot a \cdot \Delta E^* \\ 0 < a < 1 \\ 0 < b < 1 \end{cases} \qquad \text{[Expression 13]}$$

If the measurement time point k is determined to be "1" in step S46, three differences $\Delta E(k)$ chronologically calculated at the time points k (k=-2, -1, and 0) are read out of the memory and a product $\Delta E_{CST}$ of the differences is calculated and stored in the memory (S47).

The product $\Delta E_{CST}$ calculated in step S47 is compared with the predetermined reference value $E_{chk}$. If the product $\Delta E_{CST}$ is less than the predetermined reference value $E_{chk}$, the grid interconnection relay Ry1 is determined to have a welded contact (S48, N) and an error flag is set (step S31 in FIG. 4).

If the product $\Delta E_{CST}$ is not less than the predetermined reference value $E_{chk}$, the grid interconnection relay Ry1 is determined to have no welded contact (S48, Y) and the error flag is reset (step S30 in FIG. 4).

Figure 9A:
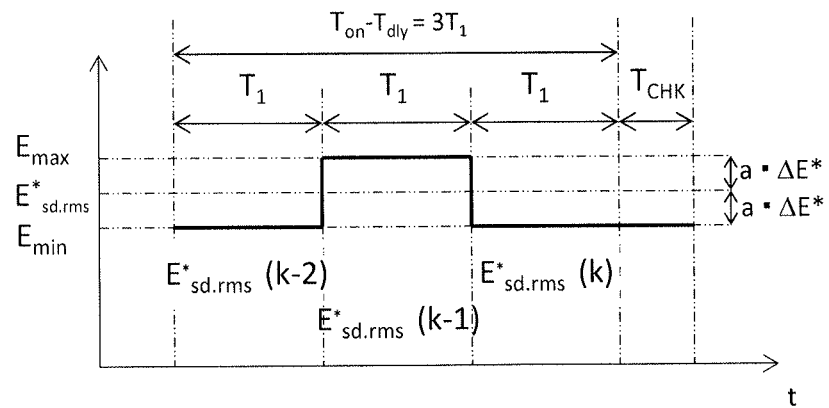
FIG. 9A is an explanatory chart of an output voltage switching sequence of the power conditioner executing the first voltage determination.
Figure 9B:
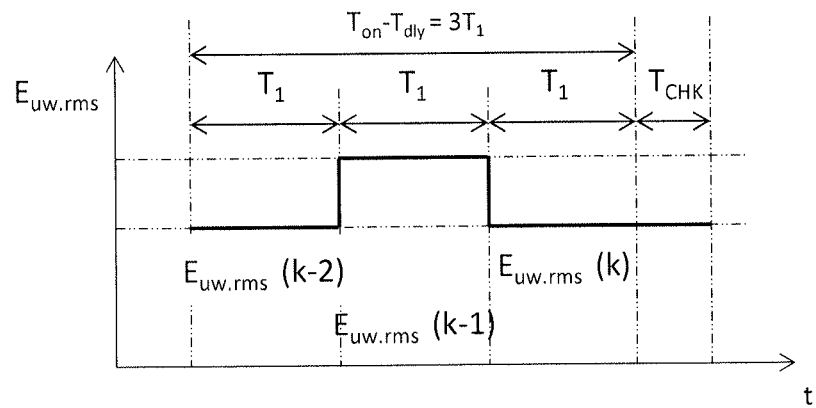
FIG. 9B is an explanatory chart of a voltage detection sequence of a commercial power system executing the first voltage determination.

FIGS. 9A and 9B indicate timing of the first voltage determination depicted in the flowcharts in FIGS. 4 and 5.

As indicated in FIG. 9A, the monitor voltage $E_{min}$ is outputted as a command value $E_{sd.rms}^*(k-2)$ of the output voltage effective value of the power conditioner PCS during the first processing period $T_1$.

As indicated in FIG. 9B, a voltage effective value $E_{uw.rms}(k-2)$ of the commercial power system is measured during the first processing period $T_1$, and a difference $\Delta E(k-2)$ between $E^*_{sd.rms}(k-2)$ and $E_{uw.rms}(k-2)$ is calculated and stored in the memory.

As indicated in FIG. 9A, the monitor voltage $E_{max}$ is outputted as a command value $E^*_{sd.rms}(k-1)$ of the output voltage effective value of the power conditioner PCS during the subsequent processing period $T_1$.

As indicated in FIG. 9B, a voltage effective value $E_{uw.rms}(k-1)$ of the commercial power system is measured during the subsequent processing period $T_1$, and a difference $\Delta E(k-1)$ between the $E^*_{sd.rms}(k-1)$ and $E_{uw.rms}(k-1)$ is calculated and stored in the memory.

As indicated in FIG. 9A, the monitor voltage $E_{min}$ is outputted as a command value $E^*_{sd.rms}(k)$ of the output voltage effective value of the power conditioner PCS during the last processing period $T_1$.

As indicated in FIG. 9B, a voltage effective value $E_{uw.rms}(k)$ of the commercial power system is measured during the last processing period $T_1$, and the difference $\Delta E(k)$ between $E^*_{sd.rms}(k)$ and $E_{uw.rms}(k)$ is calculated and stored in the memory.

The product $\Delta E_{CST}$ of the data $\Delta E(k-2)$, $\Delta E(k-1)$, and $\Delta E(k)$ stored in the memory during the period $T_{chk}$ is subsequently calculated in accordance with the mathematical expressions [Expression 14] and is compared with the predetermined reference value $E_{chk}$. Assume that the variable voltage of the command value of the output voltage of the power conditioner is $\Delta E^*$, and the confidence coefficient for adjustment of the variable voltage $\Delta E^*$ and the reference value $E_{chk}$ is a. The confidence coefficient a is set to 0.5, the command value $\Delta E^*$ of the variable output voltage is set to 20 V, the command value $E^*_{sd.rms}$ is set to 40 V, and the confidence coefficient b is set to 0.1 in the present embodiment. These values are set appropriately in accordance with actual design conditions and the like.

$$\begin{cases} \Delta E(k) = |E^*_{sd.rms}(k) - E_{uw.rms}(k)| \\ \Delta E_{CST} = \Delta E(k-2) \cdot \Delta E(k-1) \cdot \Delta E(k) \\ \Delta E_{CST} < E_{chk} \\ E_{chk} < (a \cdot \Delta E^*)^3 \end{cases} \quad \text{[Expression 14]}$$

The command values $E_{min}$ and $E_{max}$ of the output voltage effective value are preferably set in the range from $b \times E_{Grid}$ to $2 \times a \times \Delta E^*$ with respect to a rated voltage $E_{Grid}$ of the commercial power system. If there is a small difference between the command values $E_{min}$ and $E_{max}$ of the output voltage effective value, there may not be recognized a very large difference in product $\Delta E_{CST}$ between the case where the grid interconnection relay Ry1 has a welded contact and the case where the grid interconnection relay Ry1 has no welded contact, due to hum noise. In consideration of such cases, the command values $E_{min}$ and $E_{max}$ of the output voltage effective value are set to fall within the range from $b \times E_{Grid}$ to $2 \times a \times \Delta E^*$ so as to cause a significant difference in product $\Delta E_{CST}$ between the case where the grid interconnection relay Ry1 has a welded contact and the case where the grid interconnection relay Ry1 has no welded contact.

As described above, in the abnormality detection device for the grid interconnection relay Ry1 according to the present invention, a circuit element configured to detect an output voltage and an output current of the power conditioner PCS, as well as a commercial power system voltage is originally required for control of the power conditioner PCS and there is thus no need to separately provide any sensor or any circuit element for determination of welding of the grid interconnection relay Ry1.

Whether or not the contacts of the grid interconnection relay Ry1 have a welding abnormality is reliably detected regardless of whether or not the AC load $R_{uw}$ is connected, and regardless of whether or not there is a commercial power system voltage.

Figure 10A:
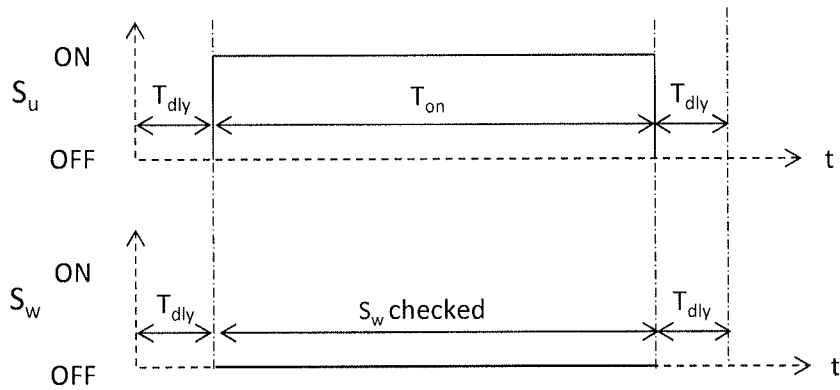
FIG. 10A is an explanatory chart of a contact control sequence for detection of welding at a contact $S_w$ upon the first voltage determination.
Figure 10B:
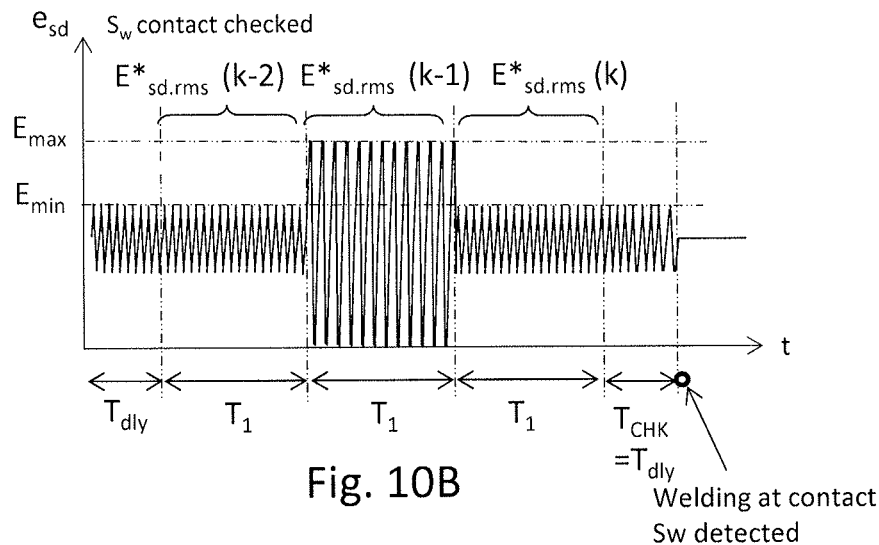
FIG. 10B is an explanatory chart of an output voltage waveform of the power conditioner during the contact control sequence indicated in FIG. 10A.
Figure 10C:
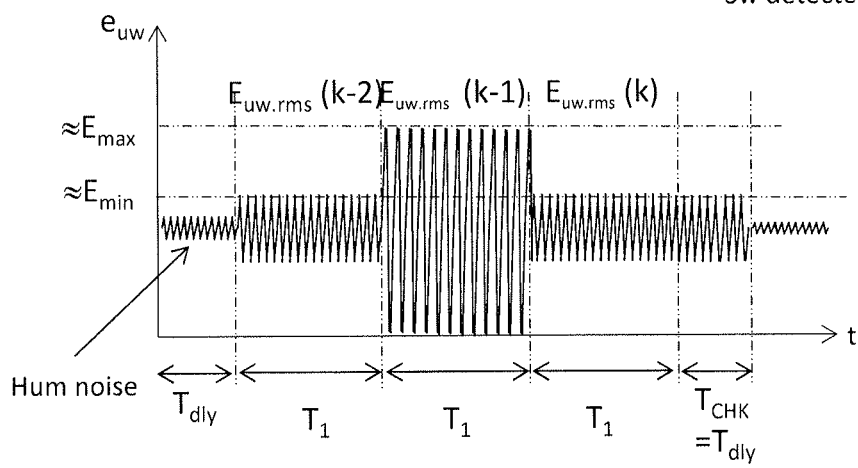
FIG. 10C is an explanatory chart of a voltage waveform of the commercial power system corresponding to FIG. 10B in a case where welding at the contact $S_w$ is detected.
Figure 11A:
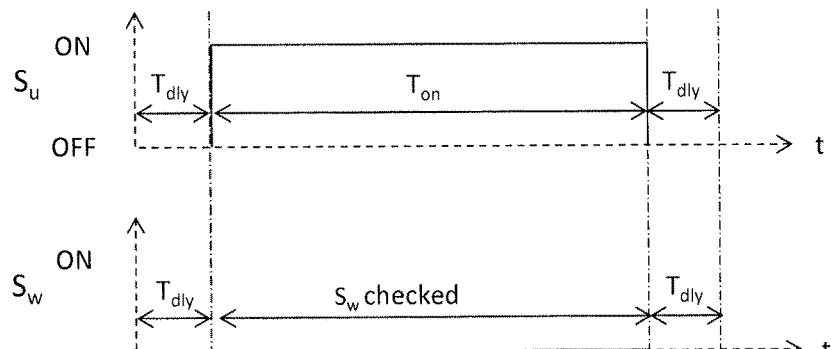
FIG. 11A is an explanatory chart of the contact control sequence for detection of welding at the contact $S_w$ upon the first voltage determination.

FIGS. 10A to 10C and FIGS. 11A to 11C each exemplify a test result of the first voltage determination according to the present invention. Specifically, in the state where the contact $S_u$ is closed and the contact $S_w$ is opened out of the contacts $S_u$ and $S_w$ of the grid interconnection relay Ry1 as indicated in FIGS. 10A and 11A in the contact control in step S22 in FIG. 4, the first voltage determination is executed. FIGS. 10B, 10C, 11B, and 11C indicate results thereof, i.e. results of welding determination as to the contact S.

Such tests were conducted under conditions of the check period $T_{ON}=1$ sec. and the delay period $T_{dly}=0.3$ sec. indicated in FIG. 2, as well as the monitor voltage $E_{min}=30$ V, the monitor voltage $E_{max}=50$ V, the check period $T1=0.2$ sec., and the reference value $E_{chk}=125$ V.

As indicated in FIG. 10B, using the grid interconnection relay Ry1 having the welded contact $S_w$, in the state where the contact $S_u$ is controlled to close and the contact $S_w$ is controlled to open in the contact control step, the power conditioner PCS outputted the voltage $e_{sd}$ chronologically alternately in the order of $E_{min}$ (=30 V), $E_{max}$ (=50 V), and $E_{min}$ (=30 V) in the cycles $T_1$ (=0.2 sec.$\approx(T_{ON}-T_{dly})/3$).

As indicated in FIG. 10C, the voltage $e_{uw}$ substantially equal to the voltage $e_{sd}$ is also detected at the commercial power system because the contact $S_w$ of the grid interconnection relay Ry1 is welded. The values $\Delta E$ calculated in the respective cycles $T_1$ are thus substantially zero. The product $\Delta E_{CST}$ of $\Delta E(k-2)$, $\Delta E(k-1)$, and $\Delta E(k)$ was subsequently calculated during the period $T_{chk}$ and the product was determined to be less than $E_{chk}$ (=125 V), so that the grid interconnection relay Ry1 was determined to have a welded contact. In FIG. 10C, there is recognized slight hum noise in a waveform of the commercial power system voltage $e_{uw}$ while the power conditioner PCS outputs no voltage.

Figure 11B:
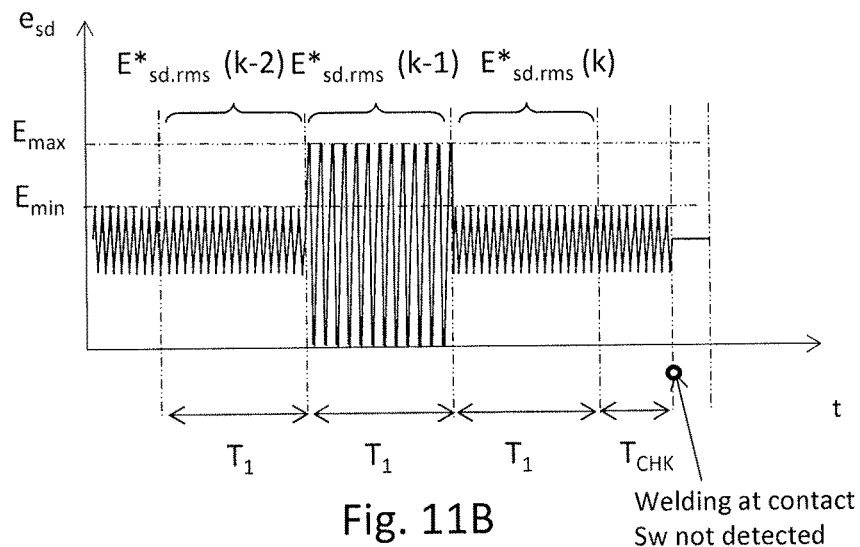
FIG. 11B is an explanatory chart of an output voltage waveform of the power conditioner during the contact control sequence indicated in FIG. 11A.
Figure 11C:
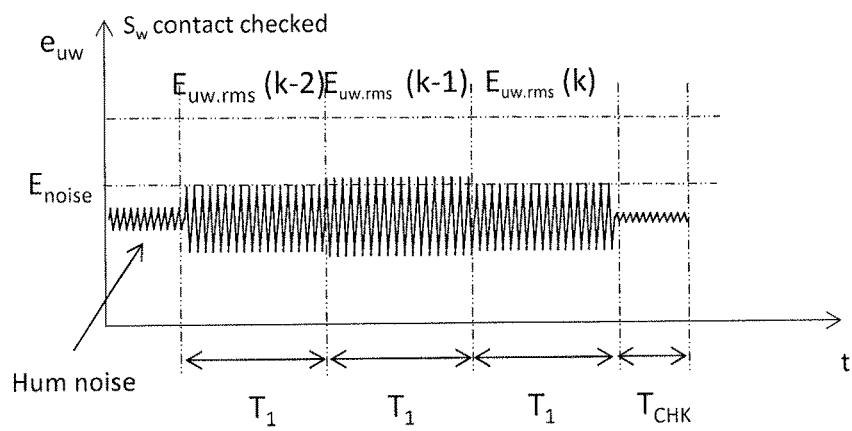
FIG. 11C is an explanatory chart of a voltage waveform of the commercial power system corresponding to FIG. 11B in a case where welding at the contact $S_w$ is not detected.

As indicated in FIG. 11C, using the grid interconnection relay Ry1 having the normal contact $S_w$ with no welding, in the state where the contact $S_u$ is controlled to close and the contact $S_w$ is controlled to open in the contact control step, the power conditioner PCS outputted the voltage chronologically alternately in the order of $E_{min}$ (=30 V), $E_{max}$ (=50 V), and $E_{min}$ (=30 V) in the cycles $T_1$ (=0.2 sec.$\approx(T_{ON}-T_{dly})/3$).

As indicated in FIG. 11C, the voltage $e_{sd}$ is not detected at the commercial power system because the contact $S_w$ of the grid interconnection relay Ry1 is not welded. The hum noise, however, has a larger value due to the voltage $e_{sd}$ outputted from the power conditioner PCS. Determination only according to the value $\Delta E(k)$ will lead to erroneous determination that the grid interconnection relay Ry1 has a welded contact. It is because the differences $\Delta E(k-2)$, $\Delta E(k-1)$, and $\Delta E(k)$ in FIG. 10C are not significantly different from the differences $\Delta E(k-2)$, $\Delta E(k-1)$, and $\Delta E(k)$ in FIG. 11C.

However, as indicated in FIGS. 11B and 11C, the hum noise is not largely varied in level in a case where the voltage $e_{sd}$ outputted from the power conditioner PCS is varied stepwise from 30 V to 50 V. The product $\Delta E_{CST}$ of $\Delta E(k-2)$, $\Delta E(k-1)$, and $\Delta E(k)$ was thus determined to be more than $E_{chk}$ (=125 V), so that the grid interconnection relay Ry1 was accurately determined to have no welded contact.

If the grid interconnection relay Ry1 in FIGS. 10B and 10C has welding, the differences $\Delta E$ are designed to a half of the command value of total variable voltages (0.5×a× ΔE*). The differences ΔE are about 5 V, and the reference value $E_{chk}$ set in the range from $5^3$ (=125 V) to $6^3$ (=216 V) is evaluated as being appropriate. The value Ethic is appropriately determined in consideration of the command values $E_{min}$ and $E_{max}$ of the output voltage effective value. This exponent 3 corresponds to the number of the sampled differences.

Other embodiments will be described below.

The embodiment described above exemplifies the case where the command value of the output voltage effective value of the power conditioner PCS is outputted in the three cycles by alternately adopting the two values $E_{min}$ and $E_{max}$ in the first voltage determination. The number of the command values is not necessarily two and at least voltages having different values are applicable. Furthermore, the number of cycles is not necessarily three and has only to be at least two.

The power conditioner PCS has only to chronologically alternately output the different monitor voltages $E_{min}$ and $E_{max}$ for abnormality determination as to the grid interconnection relay Ry1 according to whether or not the difference between the voltage of the power conditioner PCS and the voltage of the commercial power system with respect to each of the monitor voltages $E_{min}$ and $E_{max}$ follows the corresponding monitor voltage.

The monitor voltages $E_{min}$ and $E_{max}$ can obviously be chronologically alternately outputted in the order of $E_{min}$, $E_{max}$, and $E_{min}$, as well as in the order of $E_{max}$, and $E_{min}$, and $E_{max}$. In other words, the monitor voltages having the command values $E_{min}$ and $E_{max}$ of the output voltage effective value have only to be outputted chronologically alternately.

The above embodiment exemplifies the aspect in which the product $\Delta E_{CST}$ of the differences $\Delta E(k-2)$, $\Delta E(k-1)$, and $\Delta E(k)$ is compared with the reference value $E_{chk}$ for abnormality or normality determination. Alternatively, the differences are each compared with a preliminarily set reference value so as to be determined to be abnormal or normal, and final abnormality or normality determination is executed in a case where all the differences are determined to be normal.

Still alternatively, abnormality or normality determination is executed in accordance with whether or not the differences are similarly varied in accordance with the variation between the monitor voltages $E_{min}$ and $E_{max}$. If the differences are varied similarly with the varied monitor voltages $E_{min}$ and $E_{max}$, the grid interconnection relay Ry1 is determined to be normal. In contrast, if the differences are not varied in accordance with the varied monitor voltages $E_{min}$ and $E_{max}$, the grid interconnection relay Ry1 is determined to be abnormal.

The abnormality detection device for the grid interconnection relay according to the present invention has only to include the abnormality detector configured to execute the commercial power system voltage determination of determining whether or not there is a commercial power system voltage, and, if it is determined that there is no commercial power system voltage through the commercial power system voltage determination, execute the first voltage determination of causing the power conditioner to chronologically alternately output the monitor voltages having different values in the state where the grid interconnection relay has a contact controlled to open, and determining whether or not the grid interconnection relay has an abnormality in accordance with whether or not the difference between the power conditioner voltage and the commercial power system voltage with respect to each of the monitor voltages follows the corresponding monitor voltage.

The above embodiments of the present invention exemplify the case where the power conditioner PCS is configured for single-phase output. The present invention is also applicable to a case where the power conditioner PCS is configured for three-phase output and the grid interconnection relay Ry1 includes three contacts $S_u$, $S_v$, and $S_w$.

The abnormality detection device for the grid interconnection relay according to each of the above embodiments exemplifies the distributed power supply including the solar panel SP and the power conditioner PCS connected to the solar panel SP. The power generator incorporated in the distributed power supply is not limited to the solar panel SP but is appropriately selected from a wind power generator, a fuel cell, and the like.

The embodiments described above merely exemplify the method of detecting an abnormality of the grid interconnection relay and the power conditioner according to the present invention. The description is not intended to limit the technical scope of the present invention. It is obvious that the specific circuit configuration and abnormality detection algorithm can appropriately be modified in design as long as the functional effects of the present invention are exerted.

REFERENCE SIGNS LIST

1: Distributed power supply
2: DC/DC converter
3: DC/AC inverter
4: LC filter
5: Control unit
5a: Converter controller
5b: Inverter controller
5c: Abnormality detector
PCS: Power conditioner
Ry1: Grid interconnection relay
Ry2: Stand-alone power system relay
$S_u$, $S_w$: Contact

The invention claimed is:

1. An abnormality detector for a grid interconnection relay and configured to be incorporated in a power conditioner configured to be switched between grid connected operation by interconnection with a commercial power system via the grid interconnection relay and grid independent operation by power supply to a stand-alone power system not connected to the commercial power system via a stand-alone power system relay, the power conditioner including an inverter configured to convert DC power to AC power and an LC filter configured to remove a high frequency component from an output voltage of the inverter, the abnormality detector being configured to detect an abnormality of the grid interconnection relay upon switching to grid independent operation, the abnormality detector comprising:

a processor programmed to:
determine when there is a commercial power system voltage;
when it is determined that there is no commercial power system voltage, cause the power conditioner to alternately output monitor voltages having different values in a state where a contact of the grid interconnection relay is controlled to open; and
determine that the grid interconnection relay is abnormal when each of the monitor voltages is followed by a difference between a voltage of the power conditioner and a voltage of the commercial power system with respect to a corresponding one of the monitor voltages, and a product of the differences between the voltage of the power conditioner and the voltage of the commercial power system is less than a predetermined reference value.

2. The abnormality detector for the grid interconnection relay according to claim 1, wherein, when a command value of a variable output voltage of the power conditioner is ΔE*, a confidence coefficient for adjustment of the command value ΔE* of the variable output voltage and a reference value $E_{chk}$ is a, and a confidence coefficient for a commercial power system voltage $E_{Grid}$ is b, when chronologically alternately outputting at least monitor voltages having command values $E_{min}$ and $E_{max}$ ($E_{min}<E_{max}$) of an output voltage effective value indicated in mathematical expressions [Expression 1], the processor is programmed to:

calculate a product $\Delta E_{CST}$ of differences ΔE each between the voltage of the power conditioner and the voltage of the commercial power system in accordance with mathematical expressions [Expression 2] wherein a sampling time point k; and determine that the grid interconnection relay is abnormal based on whether or not the product $\Delta E_{CST}$ of the differences ΔE is less than the predetermined reference value $E_{chk}$;

$$\begin{cases} E_{max} = E^*_{sd.rms} + a \cdot \Delta E^* \\ E_{min} = E^*_{sd.rms} - a \cdot \Delta E^* \\ b \cdot E_{Grid} \leq E_{max} - E_{min} \leq 2 \cdot a \cdot \Delta E^* \\ 0 < a < 1 \\ 0 < b < 1 \end{cases}$$ [Expression 1]

$$\begin{cases} \Delta E(k) = |E^*_{sd.rms}(k) - E_{uw.rms}(k)| \\ \Delta E_{CST} = \Delta E(k-2) \cdot \Delta E(k-1) \cdot \Delta E(k) \\ \Delta E_{CST} < E_{chk} \\ E_{chk} < (a \cdot \Delta E^*)^3 \end{cases}$$ [Expression 2]

3. The abnormality detector for the grid interconnection relay according to claim 2, wherein the command values $E_{min}$ and $E_{max}$ of the output voltage effective value are set in a range from $b \times E_{Grid}$ to $2 \times a \times \Delta E^*$ with respect to the rated voltage $E_{Grid}$ of the commercial power system.

4. The abnormality detector for the grid interconnection relay according to claim 1, wherein the processor is programmed to:

when it is determined that there is a commercial power system voltage:
set the output voltage of the power conditioner to zero; and
determine that the grid interconnection relay is abnormal based on a magnitude relation between a difference between the voltage of the power conditioner and the voltage of the commercial power system, and a value obtained by multiplying the predetermined reference value by a predetermined confidence coefficient in a state where the contact of the grid interconnection relay is controlled to open.

5. The abnormality detector for the grid interconnection relay according to claim 1, wherein the processor is programmed to:

when it is determined that there is a commercial power system voltage, determine that the grid interconnection relay is abnormal when there is an input current to the power conditioner in the state where the contact of the grid interconnection relay is controlled to open; and when it is determined that there is no commercial power system voltage, determine that the grid interconnection relay is abnormal when there is an output current from the power conditioner in the state where the contact of the grid interconnection relay is controlled to open.

6. The abnormality detector for the grid interconnection relay according to claim 5, wherein, when the LC filter has capacitor capacity $C_{inv}$, internal resistance $R_c$, and a capacitor current $i_c$, and a stand-alone power system voltage $e_{sd}$ is a measurement value, the processor is programmed to:

calculate, as the input current of the capacitor current $i_c$ in accordance with a mathematical expression [Expression 3]:

$$i_c = \frac{sC_{inv}}{sR_cC_{inv}+1} \cdot e_{sd}.$$

7. The abnormality detector for the grid interconnection relay according to claim 6, wherein the processor is programmed to:

determine that the grid interconnection relay is abnormal when the input current measured in a predetermined sampling cycle has an absolute value not less than a predetermined threshold a plurality of consecutive times and the absolute value of the input current increases every time the output current is measured.

8. The abnormality detector for the grid interconnection relay according to claim 5, wherein, when the LC filter has capacitor capacity $C_{inv}$, internal resistance $R_c$, an output voltage $e_{sd}$ at grid independent operation, and a capacitor current $i_c$, and an inverter current $i_{inv}$ is a measurement value, the processor is programmed to:

calculate, as the output current, an output current $i_{sp}$ of the power conditioner in accordance with a mathematical expression [Expression 4]:

$$i_{sp}=i_{inv}-i_c.$$

9. The abnormality detector for the grid interconnection relay according to claim 8, wherein the processor is programmed to:

determine that the grid interconnection relay is abnormal when a difference in absolute value of peak values of the output current of the power conditioner is not less than a predetermined threshold a plurality of consecutive times and the absolute value of the peak value decreases every time the output current is measured.

10. The abnormality detector for the grid interconnection relay according to claim 1, wherein the processor is programmed to:

execute abnormality detection processes after all contacts of the grid interconnection relay are controlled to open and execute the abnormality detection processes when one of the contacts is controlled to close independently.

11. The abnormality detector for the grid interconnection relay according to claim 1, wherein the processor is programmed to:

determine when there is a commercial power system voltage in accordance with a magnitude relation between a value obtained by multiplying a preliminarily set output voltage set value of the power conditioner by a predetermined confidence coefficient and the commercial power system voltage, and a magnitude relation between a value obtained by multiplying a stand-alone power system frequency by a predetermined confidence coefficient and a commercial power system frequency.

12. A power conditioner of a single-phase or three-phase type, provided with an inverter configured to convert DC power to AC power and an LC filter configured to remove a high frequency component from an output voltage of the inverter, the power conditioner comprising:
 a processor programmed to:
  switch between grid connected operation by interconnection with a commercial power system via a grid interconnection relay and grid independent operation by power supply to a stand-alone power system not connected to the commercial power system via a stand-alone power system relay;
 determine when there is a commercial power system voltage;
  when it is determined that there is no commercial power system voltage, cause the power conditioner to alternately output monitor voltages having different values in a state where a contact of the grid interconnection relay is controlled to open; and
  determine that the grid interconnection relay is abnormal when each of the monitor voltages is followed by a difference between a voltage of the power conditioner and a voltage of the commercial power system with respect to a corresponding one of the monitor voltages, and a product of the differences between the voltage of the power conditioner and the voltage of the commercial power system is less than a predetermined reference value.

* * * * *